US010393827B2

(12) United States Patent
Lacouture et al.

(10) Patent No.: US 10,393,827 B2
(45) Date of Patent: Aug. 27, 2019

(54) MAGNETIC FIELD VECTOR IMAGING ARRAY

(71) Applicant: Texas Tech University System, Lubbock, TX (US)

(72) Inventors: Shelby Lacouture, Lubbock, TX (US); Argenis Bilbao, Lubbock, TX (US); Stephen Bayne, Lubbock, TX (US)

(73) Assignee: Texas Tech University System, Lubbock, TX (US)

( * ) Notice: Subject to any disclaimer, the term of this patent is extended or adjusted under 35 U.S.C. 154(b) by 85 days.

(21) Appl. No.: 15/611,988

(22) Filed: Jun. 2, 2017

(65) Prior Publication Data

US 2017/0350947 A1 Dec. 7, 2017

Related U.S. Application Data

(60) Provisional application No. 62/345,275, filed on Jun. 3, 2016.

(51) Int. Cl.
*G01R 33/07* (2006.01)
*G01R 33/00* (2006.01)

(52) U.S. Cl.
CPC ......... *G01R 33/07* (2013.01); *G01R 33/0005* (2013.01); *G01R 33/0094* (2013.01)

(58) Field of Classification Search
CPC . G01R 33/07; G01R 33/0094; G01R 33/0005
See application file for complete search history.

(56) References Cited

U.S. PATENT DOCUMENTS 4,633,182 A * 12/1986 Dzwinel .................. G01V 3/12 324/335
5,073,858 A * 12/1991 Mills ...................... G01R 33/16 324/201
6,429,657 B1 8/2002 Blish, II
6,759,843 B2 7/2004 Furlong
7,019,521 B2 3/2006 Orozco et al.
7,205,622 B2 4/2007 Alimi et al.
7,250,757 B1 7/2007 Tiernan
7,405,562 B2 7/2008 Ghallab et al.
7,626,377 B2 12/2009 Kilian et al.
8,154,285 B1 4/2012 Hyde et al.
8,723,514 B2 5/2014 Finkler et al.
9,255,978 B2 2/2016 Fallone et al.
(Continued)

OTHER PUBLICATIONS

Lilley, F. E. M., Magnetometer Array Studies: A Review of the Interpretation of Observed Fields, Physics of the Earth and Planetary Interiors (1975) 10:231-240.

Steinert, S. et al., High sensitivity magnetic imaging using an array of spins in diamond, Rev. Sci. Instrum. (2010) 81(4):043705, 13 pages.

Mann, I. R. et al., The Upgraded Carisma Magnetometer Array in the Themis Era, Space Sci. Rev. (2008) 141:413-451.

(Continued)

*Primary Examiner* — Huy Q Phan
*Assistant Examiner* — Zannatul Ferdous
(74) *Attorney, Agent, or Firm* — Kermit D. Lopez; Luis M. Ortiz; Ortiz & Lopez, PLLC

(57) ABSTRACT

Methods and systems for imaging a magnetic field as vectors (or scalars if desired) in either two or three dimensions without the need for rastering or relative motion between the sensors and the magnetic field being viewed. A secondary function is to image electric current flow as vectors. Example embodiments can be scaled to fit both large and small applications by using discreet devices or manufacturing with MEMS technologies.

20 Claims, 6 Drawing Sheets

(56) References Cited

U.S. PATENT DOCUMENTS

| | | | | |
|---|---|---|---|---|
| 9,625,555 | B2 | 4/2017 | Ryu et al. | |
| 2005/0258828 | A1* | 11/2005 | Johnson | G01R 33/07 324/251 |
| 2006/0206024 | A1* | 9/2006 | Weeks, Jr. | A61B 5/0006 600/418 |
| 2007/0167723 | A1 | 7/2007 | Park et al. | |
| 2009/0149736 | A1* | 6/2009 | Skidmore | A61B 5/04009 600/421 |
| 2010/0097059 | A1* | 4/2010 | Estrada | G01R 33/0005 324/251 |
| 2010/0301849 | A1* | 12/2010 | Xu | A61B 5/05 324/214 |
| 2015/0306340 | A1* | 10/2015 | Giap | G06F 19/00 600/301 |
| 2016/0091981 | A1 | 3/2016 | Hautson et al. | |
| 2016/0370441 | A1* | 12/2016 | Goodson | G01R 33/10 |
| 2017/0030981 | A1 | 2/2017 | Lynde et al. | |

OTHER PUBLICATIONS

Cutler, J. et al., CalMagNet—an array of search coil magnetometers monitoring ultra low frequency activity in California, Nat. Hazards Earth Syst. Sci. (2008) 8:359-368.
Firmware—Wikipedia, printed May 16, 2017, 6 pages.
Hall effect—Wikipedia, the free encyclopedia, printed May 25, 2016, 11 pages.
Hall effect sensor—Wikipedia, the free encyclopedia, printed May 25, 2016, 5 pages.
Saito, H. et al., Magnetic field imaging using ct technique—roi reconstruction system, Syst. Comp. Jpn. (1993) 24:93-104.
Tchernychev, M. et al., Multiple Magnetometer Sensor Arrays and their Applications in Marine Environmental Surveys, Ocean News & Technology May 27, 2014, 9 pages.
Microcontroller—Wikipedia, printed May 16, 2017, 11 pages.
Microprocessor—Wikipedia, printed May 16, 2017, 18 pages.
Processor (computing)—Wikipedia, printed May 16, 2017, 1 page.

* cited by examiner

MAGNETIC FIELD VECTOR IMAGING ARRAY

CROSS-REFERENCE TO PROVISIONAL APPLICATION

This nonprovisional patent application claims the benefit under 35 U.S.C. § 119(e) of U.S. Provisional Patent Application Ser. No. 62/345,275, filed on Jun. 3, 2016, entitled "Magnetic Field Vector Imaging Array." U.S. Provisional Patent Application Ser. No. 62/345,275 is incorporated herein by reference in its entirety.

TECHNICAL FIELD

Embodiments are related to imaging devices, circuits, and applications. Embodiments also relate to the imaging of magnetic fields. Embodiments further relate to a magnetic field vector imaging array.

BACKGROUND

Current techniques for imaging magnetic fields require relative motion between the field and a sensor to build up an image bit by bit, an image that is invariably made up of scalar representations of the magnetic field's magnitude at points in space, or by using an array of single Hall-Effect devices, which produces a scalar image of the components of the magnetic field that lie in the sensing direction of the individual Hall-Effect elements, not a true scalar image of the three dimensional magnetic field itself.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is therefore one aspect of the disclosed embodiments to provide for improved imaging systems including imaging devices, circuits, and applications thereof.

It is another aspect of the disclosed embodiments to provide for a system and method for imaging magnetic fields.

It is yet another aspect of the disclosed embodiments to provide for a magnetic field vector imaging array system and method.

The aforementioned aspects and other objectives and advantages can now be achieved as described herein. In an example embodiment, a magnetic field vector imaging array system can include a magnetometer array that images at least one magnetic field as a full two- or three-dimensional vector field, thereby allowing said at least one magnetic field to be viewable. Such a system can further include an electronic display that is operably connected to said magnetometer array and which displays an image of said at least one magnetic field as a vector array with both magnitude and direction at each sensing point in space or as a scalar image with each point being calculated from vector components of said at least one magnetic field.

The disclosed embodiments thus relate to a device and/or system for imaging magnetic fields as an array of vectors in two and/or three dimensions. The device or system can image magnetic fields without any relative motion between the field and the sensor, and is fully capable of imaging static magnetic fields, and displaying the field as either a vector array with both magnitude and direction at each sensing point in space, or as a scalar image with each point being calculated from the vector components of the magnetic field.

The disclosed embodiments can include an N×N vector magnetometer array that is used to image magnetic fields including static magnetic fields as a full, three dimensional vector field. The disclosed embodiments allow the abstract concept of a magnetic field to be viewed. The disclosed embodiments can image current flow in real time allowing semiconductor device manufacturers to see physical current flows.

BRIEF DESCRIPTION OF THE DRAWINGS

The accompanying figures, in which like reference numerals refer to identical or functionally-similar elements throughout the separate views and which are incorporated in and form a part of the specification, further illustrate the disclosed embodiments and, together with the detailed description of the disclosed embodiments, serve to explain the principles of the present invention.

DETAILED DESCRIPTION

Figure 1:
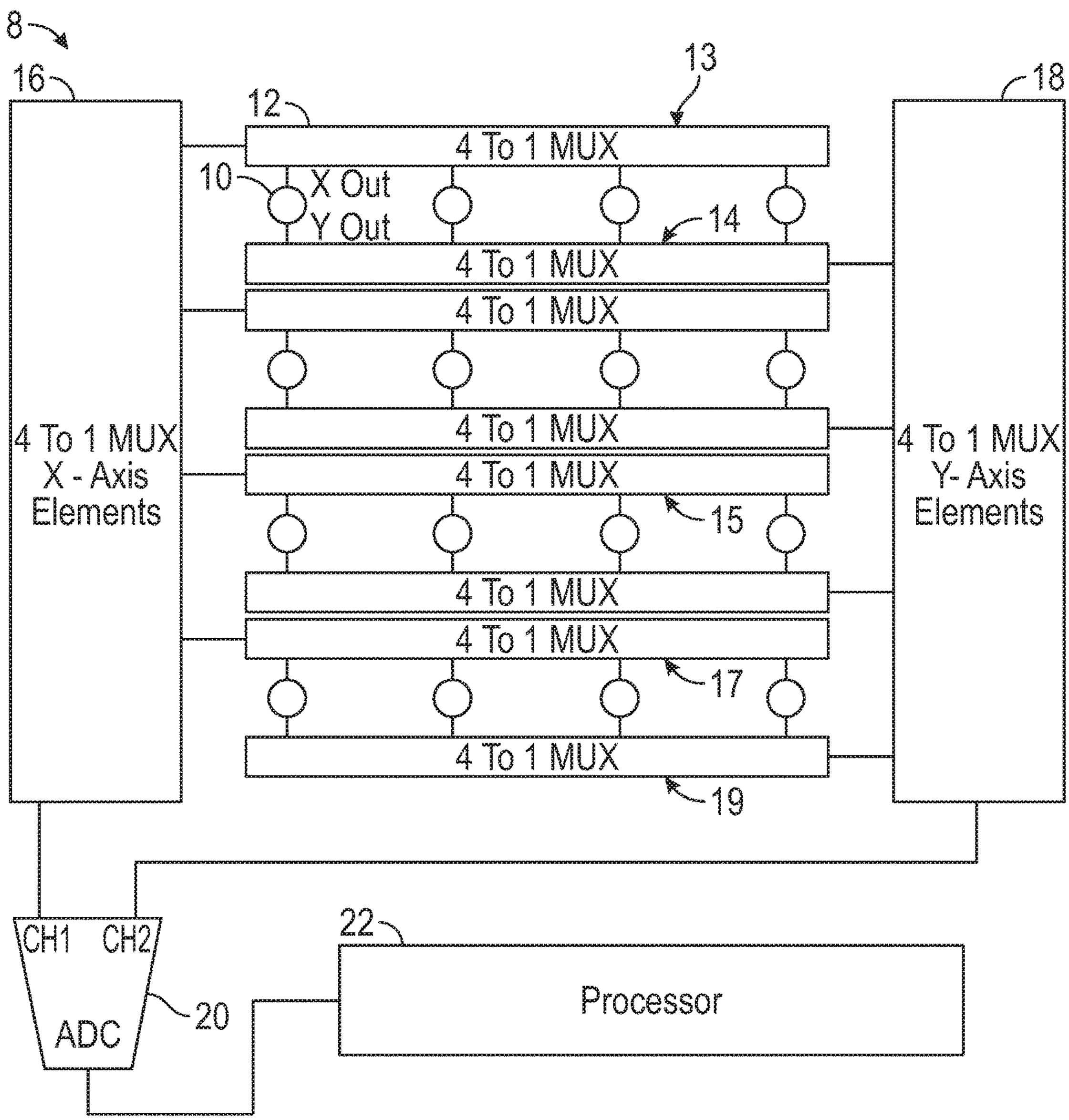
FIG. 1 illustrates a block diagram of a 4×4 imaging system, in accordance with an example embodiment.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to identical, like, or similar elements throughout, although such numbers may be referenced in the context of different embodiments. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms such as "and," "or," or "and/or" as used herein may include a variety of meanings that may depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The disclosed example embodiments are directed to a system and method for imaging magnetic fields as an array of vectors in two and/or three dimensions. As will be explained in greater detail, an example embodiment can include a system that images magnetic fields without any relative motion between field and sensor, and which is fully capable of imaging static magnetic fields. Such a system can also display the field as either a vector array with both magnitude and direction at each sensing point in space, or as a scalar image with each point being calculated from the vector components of the magnetic field (i.e., the square root of the sum of the squares of each axially aligned components magnitude).

An N×N (arbitrary) array of sensor elements can be configured with each element composed of two to three individual linear Hall-Effect devices aligned orthogonally to each other. This perpendicular alignment of the Hall-Effect devices creates a two or three dimensional Cartesian coordinate system within which to reference the separate readings from the sensors, for instance. The reading from the Hall-Effect sensor aligned parallel to the x-axis is proportional to the magnitude of the field at the point where the sensor is located and the Cosine of the angle of the magnetic field vector normal to the sensor (i.e., the x-axis). Thus, the scalar output voltage of this sensor gives the magnitude of the vector component of the magnetic field along the x-axis at this point in space.

The other device(s) provide the components in the direction of each respective axis to create a complete magnetic field vector in two or three dimensions. The present invention can be physically scaled to image large magnetic fields by using discreet Hall-Effect devices or manufactured using Micro Electro Mechanical (MEMs) techniques to image very small fields.

An important secondary application of one or more of the disclosed example embodiments is its potential use to image electric current flow at the surface of a conductor or a conducting device. This use follows naturally from the interrelationship between flowing electric current and the resultant magnetic fields (i.e., the Biot-Savart Law).

FIG. 1 illustrates a block diagram of a system 8 composed of a simple 4×4 sensor array of 2D elements (e.g., two orthogonally aligned Hall-Effect devices per element), which constructs a vector field in two dimensions of an impinging magnetic field, in accordance with an example embodiment. Each individual element 10 of the system 8 can produce two linear output voltages: "X OUT" and "Y OUT," wherein each signal corresponds to the magnitude of the magnetic field vector's x-axis aligned component and y-axis aligned component, respectively, at the physical location in space of that particular sensing element.

For each row of sensing elements, each X OUT signal can be fed to a 1 of 4 analog switch demultiplexer 12 (in this simplified 4×4 array). The demultiplexer 12 can function as an X OUT row demultiplexer. Each rows X OUT demultiplexer can in turn be fed to an X-axis demultiplexer 16. Similarly, each rows Y OUT demultiplexer 14 can be applied to a Y-axis demultiplexer 18. That is, the demultiplexer 14 functions as a Y OUT row demultiplexer.

Note that the term "demultiplexer" as utilized herein refers to a device that can take a single input line and route it to one of several digital output lines. Thus, a demultiplexer of $2^n$ outputs has n select lines, which are used to select which output line to send the input. A demultiplexer is also called a data distributor. A multiplexer, on the other hand, is a device that selects one of several analog or digital input signals and forwards the selected input into a single line. A multiplexer of $2^n$ inputs has n select lines, which are used to select which input line to send to the output. Multiplexers are mainly used to increase the amount of data that can be sent over a network within a certain amount of time and bandwidth. A multiplexer is also called a data selector. Multiplexers can also be used to implement boolean functions of multiple variables.

An Analog to Digital Converter (ADC) 20 can be utilized to convert the linear output voltage of the sensing elements into a digital signal. A variety of demultiplexing elements are also shown in FIG. 1 including a 4 to 1 demultiplexer 13 and a demultiplexer 15 composed of a two 4 to 1 demultiplexers. In addition, a demultiplexer 17 is shown composed of two 4 to 1 demultiplexers, and finally a single 4 to 1 demultiplexer 19. A plurality of single 2D sensor elements such as the single 2D sensor element 10 are shown in FIG. 1 located between the various demultiplexers such as demultiplexer 13 and 14 and so on.

A microprocessor and/or microcontroller 22 orchestrates the timing and data transfer of the entire system. The processor portion of the microprocessor/microcontroller can read in the digital output of the ADC and transfer the data to a host computer for reconstruction of a vector or scalar image of the applied magnetic field. Alternatively, in another example embodiment, a Liquid Crystal Display (LCD) can be utilized for viewing the image in portable or handheld versions of the disclosed embodiments. The microcontroller/microprocessor 22 is electrically connected to the ADC 20, which in turn is connected electrically to the X-axis demultiplexer 16 via a first channel (CH 1) and to the Y-axis demultiplexer 18. The ADC 20 is a two-channel ADC.

The processor 22 thus can function as a combination of a microprocessor and a microcontroller, or in alternative example embodiments as a separate microprocessor or a separate microcontroller. Note that as utilized herein, the term "processor" generally refers to the processor or processor unit that is an electronic circuit that performs operations on some external data source, usually memory or some other data stream. The processor 22 may be in some example embodiments, a CPU (Central Processing Unit) in the system 8 or may be a specialized processor.

In some example embodiments, processor 22 may be a microprocessor or computer processor that incorporates the functions of a CPU on a single IC (Integrated Circuit). Such a microprocessor may be implemented as a multipurpose, clock driven, registered based, digital-integrated circuit that accepts binary data as input, processes it according to instructions stored in memory, and provides results as output. Such a microprocessor may contain both combinational logic and sequential digital logic, and can operate on numbers and symbols represented in the binary numeral system.

In some example embodiments, processor 22 may be a microcontroller of MCU (Microcontroller Unit) that functions as a small computer on a single IC. For example, such a microcontroller may be an SoC (System on a Chip) and contain one or more CPUs along with memory and programmable input/output peripherals. In some example embodiments, program memory in the form of, for example, Ferroelectric RAM, NOR flash, or OTP RAM can be included on the chip, as well as a small amount of RAM.

Figure 2:
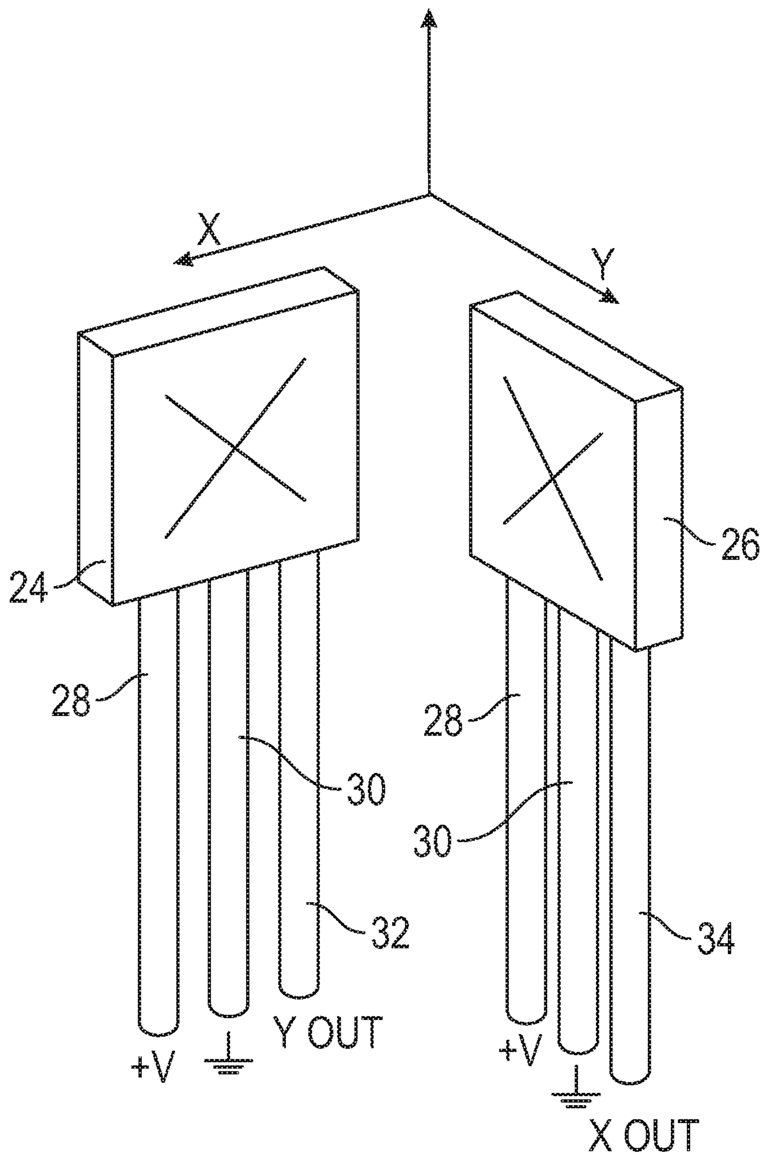
FIG. 2 illustrates a close-up of a single 2D element made from discreet Hall-Effect sensors, in accordance with an example embodiment.

FIG. 2 illustrates a view of an individual 2D sensing element constructed of discreet Hall-Effect sensors 24 and 26, in accordance with an example embodiment. A key feature of the sensing elements is the orthogonality of alignment of each individual Hall-Effect device. The y-axis Hall-Effect sensor 24 can be placed so that the normal vector of its sensing axis is parallel to the chosen y-axis reference. Likewise, the x-axis sensor 26 can be aligned with its normal vector parallel to the predetermined x-axis. Once arbitrary axes are selected, all sensing devices in an array must be precisely aligned with this chosen coordinate system. Positive supply leads 28 and ground leads 30 can route to all devices (in this example discreet system), and Y-OUT 32 and X-OUT 34 output leads can attach to demultiplexers as described in FIG. 1 above. Thus, the Y-axis Hall-Effect device 24 and the X-axis Hall-Effect device 26 are shown in FIG. 2 with respect to the positive leads 28, ground leads 30, a device Y OUT 32, and a device X OUT 34.

To implement an example embodiment on a much smaller scale, useful for imaging very small magnetic fields and for reconstructing surface electric current flows from a conductor or conducting device, the discreet linear Hall-Effect devices in the above example can be replaced by MEMS (Micro Electro Mechanical Systems) fabricated Hall-Effect structures on a single chip. The MEMs Hall-Effect array so constructed can then be mated with a Complementary Metal Oxide Semiconductor (CMOS) Very Large Scale Integrated Circuit (VLSI) to perform the demultiplexing and readout functions in a manner very similar to that currently used for thermal imaging systems using Microbolometer technology. This use of CMOS readout ICs, typically Charged Coupled Device (CCD) technology, can greatly simplify the implementation of very large imaging arrays, allowing for example embodiments with a very high resolution.

Note that as utilized herein, the term "Hall-Effect device" or "Hall-Effect sensor" refers to a transducer that varies its output voltage in response to a magnetic field. In its simplest form, the Hall-Effect device can operate as an analog transducer, directly returning a voltage. With a known magnetic field, its distance from a Hall plate can be determined. Using groups of sensors, the relative position of the magnet can be deduced. The Hall-Effect is the production of a voltage difference (the Hall voltage) across an electrical conductor, transverse to an electric current in the conductor and a magnetic field perpendicular to the current.

Figure 3:
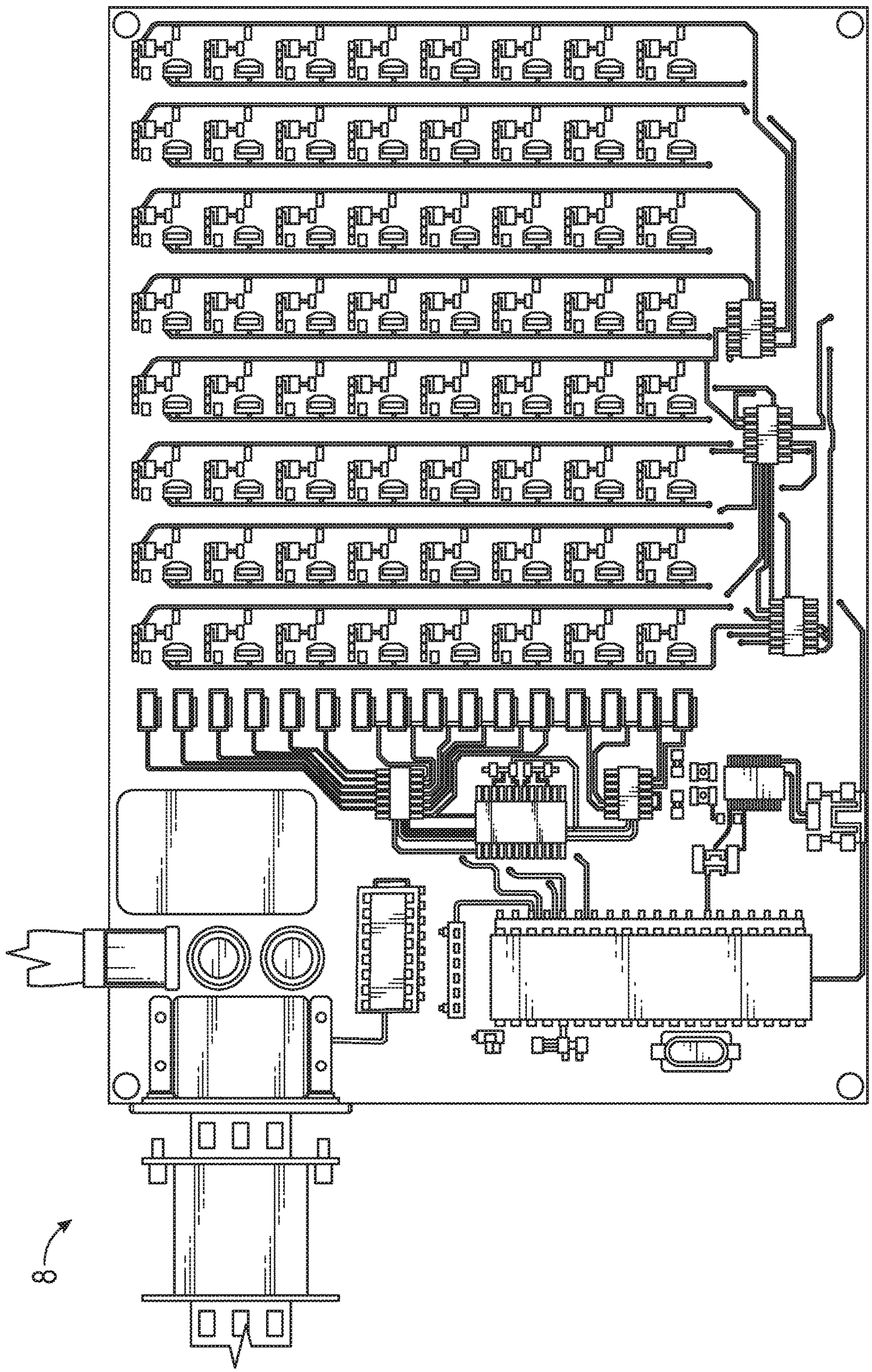
FIG. 3 illustrates an image of a prototype unit of a 8×8 magnetic field imager for implementing a system such as the system shown in FIG. 3, in accordance with an example embodiment.

FIG. 3 illustrates an image of an 8×8 magnetic field imager that can be implemented in accordance with another example embodiment. The image shown in FIG. 3 represents an example of an implementation of the system 8 shown in FIG. 1. The imager system depicted in FIG. 3, however, is an improvement and variation to the example embodiments shown in FIGS. 1-2. Thus, the image or system 8 shown in FIG. 3 represents an improvement to the system and devices shown in FIGS. 1-2. In the configuration depicted in FIG. 3, the decoding of the x, y, and z vectors has been greatly simplified by multiplexing the power supplied to each row of elements—only one row is energized at any given time, this makes addressing a large number of elements feasible. The present inventors have successfully built and tested a small-scale 8×8 array. FIG. 3 depicts an example of a prototype unit for implementing a system such as system 8.

Embodiments can include the use of, for example, firmware. Basic firmware for the disclosed system has been written as well as Windows-based software to display the vector magnetic field from the data acquired.

Note that the term "firmware" as utilized herein refers generally to a type of software that can provide control, monitoring, and data manipulation of engineering products and systems. Examples of devices containing firmware include embedded systems (e.g., traffic lights, consumer appliances, remote controls, digital watches, etc.), computers, computer peripherals, mobile phones, and digital cameras. Firmware can provide a low-level control program for a device such as, for example, the device or system 8 discussed herein.

Firmware can be held in non-volatile memory devices such as ROM, EPROM, or Flash memory. Changing the firmware of a device may rarely or never be done during its lifetime; some firmware memory devices are permanently installed and cannot be changed after manufacture. Common reasons for updating firmware include fixing bugs or adding features to the device. This may require ROM integrated circuits to be physically replaced or flash memory to be reprogrammed through a special procedure. Firmware such as the ROM BIOS of a personal computer may contain only elementary basic functions of a device and may only provide services to higher-level software. Firmware such as the program of an embedded system may be the only program that will run on the system and provide all of its functions.

Figure 4:
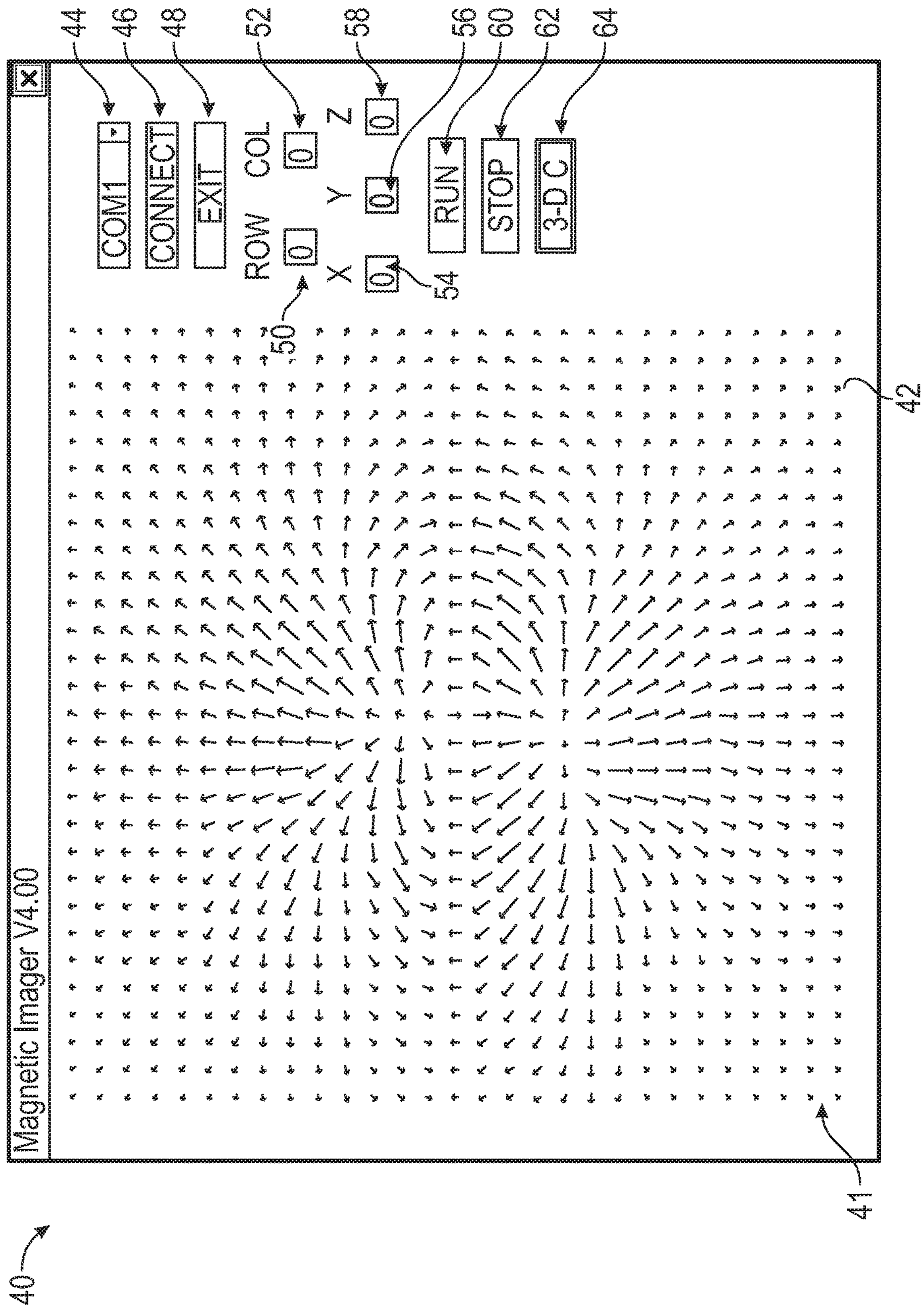
FIG. 4 illustrates an image obtained from a small magnet placed in close proximity to the sensor array.

FIG. 4 illustrates an example image 40 obtained from a small magnet placed in close proximity to the sensor array and displayed in a display area of a GUI (Graphical User Interface), in accordance with an example embodiment. The field lines depicted in the displayed image 41 and 42 show depth by modulating the width of individual vectors in accordance with the magnitude of the z-axis vector component. FIG. 4 is an thus an image of a small magnetic dipole.

The GUI 40 shown in FIG. 4 can contain a number of GUI elements and graphically displayed buttons such as, for example, a selection field 44, a button 46 ("CONNECT"), a button 48 ("EXIT"), respective row and column selection fields 50, 52, respective X, Y, and Z selection fields 54, 56, 58, a button 60 ("RUN"), a button 62 ("STOP"), and a button 64 ("3-D C).

Figure 5:
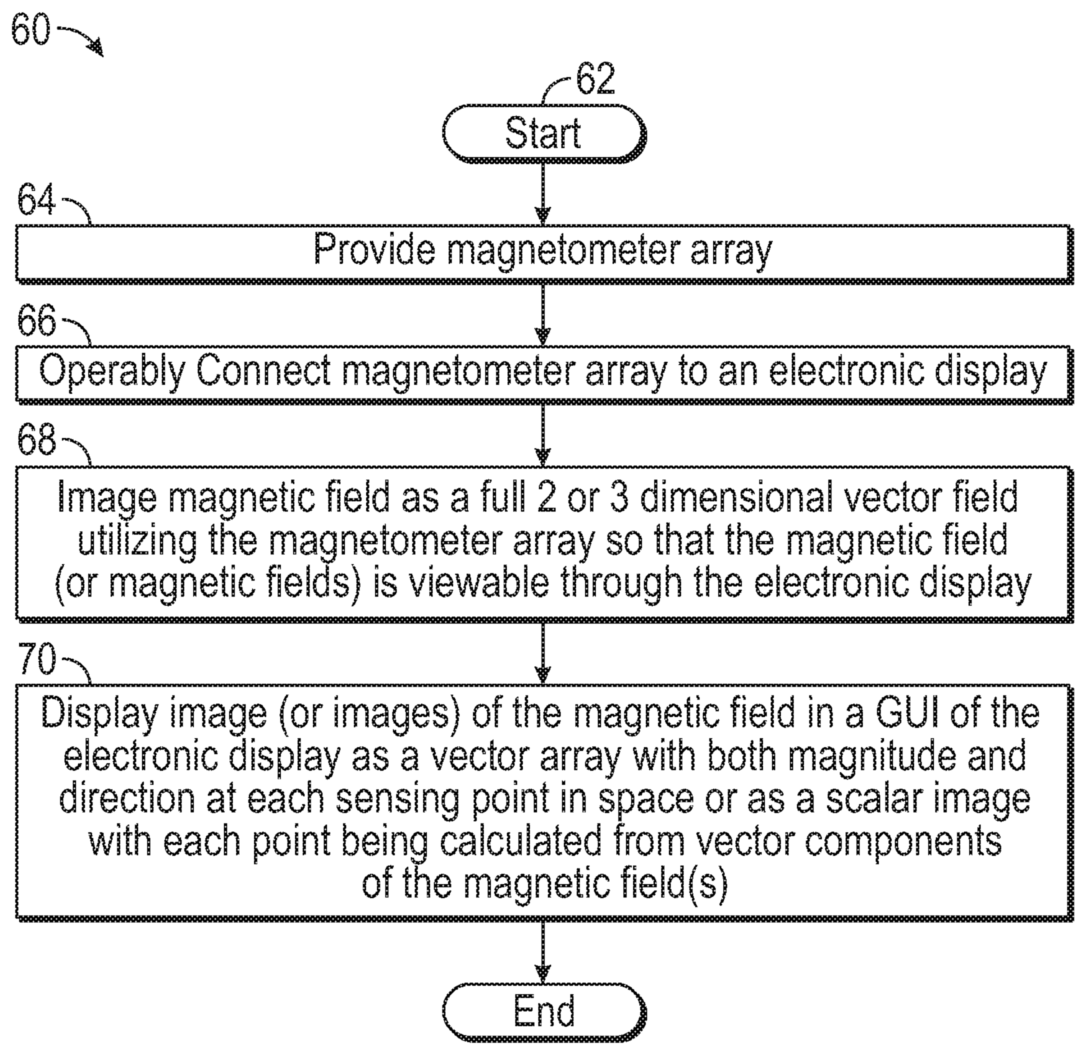
FIG. 5 illustrates a flow chart of operations illustrating logical operational steps of a method of implementing a magnetic field vector image array, in accordance with an example embodiment.

FIG. 5 illustrates a flow chart of operations illustrating logical operational steps of a method 60 of implementing a magnetic field vector image array, in accordance with an example embodiment.

As can be appreciated by one skilled in the art, embodiments can be implemented in the context of a method, data processing system, or computer program product. Accordingly, embodiments may take the form of an entire hardware embodiment, an entire software embodiment, or an embodiment combining software and hardware aspects all generally referred to herein as a "circuit" or "module." Furthermore, embodiments may in some cases take the form of a computer program product on a computer-usable storage medium having computer-usable program code embodied in the medium. Any suitable computer readable medium may be utilized including hard disks, USB Flash Drives, DVDs, CD-ROMs, optical storage devices, magnetic storage devices, server storage, databases, etc.

Computer program code for carrying out operations of the present invention may be written in an object-oriented programming language (e.g., Java, C++, etc.). The computer program code, however, for carrying out operations of particular embodiments may also be written in conventional procedural programming languages, such as the "C" programming language or in a visually oriented programming environment, such as, for example, Visual Basic.

The program code may execute entirely on the user's computer, partly on the user's computer, as a stand-alone software package, partly on the user's computer and partly on a remote computer, or entirely on the remote computer. In the latter scenario, the remote computer may be connected to a user's computer through a local area network (LAN) or a wide area network (WAN), wireless data network e.g., Wi-Fi, Wimax, 802.xx, and cellular network, or the connection may be made to an external computer via most third party supported networks (for example, through the Internet utilizing an Internet Service Provider).

The embodiments are described at least in part herein with reference to flowchart illustrations and/or block diagrams of methods, systems, and computer program products and data structures according to embodiments of the invention. It will be understood that each block of the illustrations, and combinations of blocks, can be implemented by computer program instructions. These computer program instructions may be provided to a processor of, for example, a general-purpose computer, special-purpose computer, or other programmable data processing apparatus to produce a machine, such that the instructions, which execute via the processor of the computer or other programmable data processing apparatus, create means for implementing the functions/acts specified in the block or blocks. To be clear, the disclosed embodiments can be implemented in the context of, for example a special-purpose computer or a general-purpose computer, or other programmable data processing apparatus or system. For example, in some embodiments, a data processing apparatus or system can be implemented as a combination of a special-purpose computer and a general-purpose computer.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the various block or blocks, flowcharts, and other architecture illustrated and described herein.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
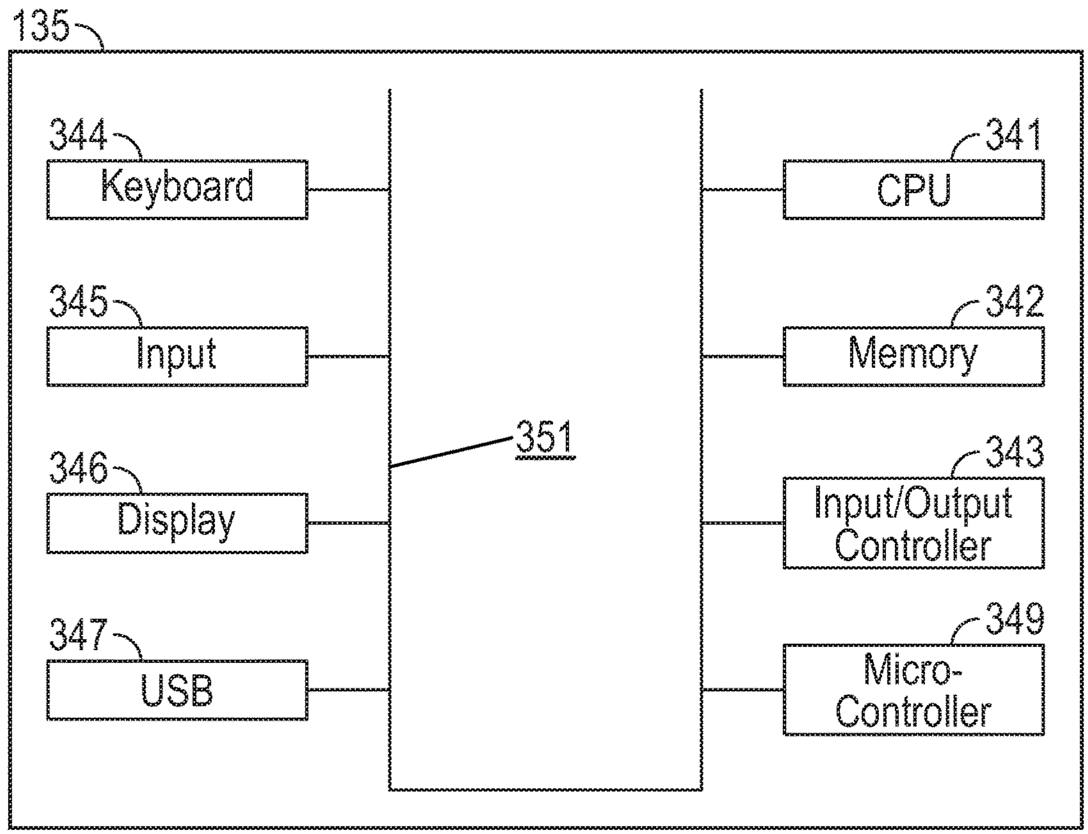
FIG. 6 illustrates a schematic view of a computer system/apparatus, which can be adapted for use in accordance with an example embodiment.
Figure 7:
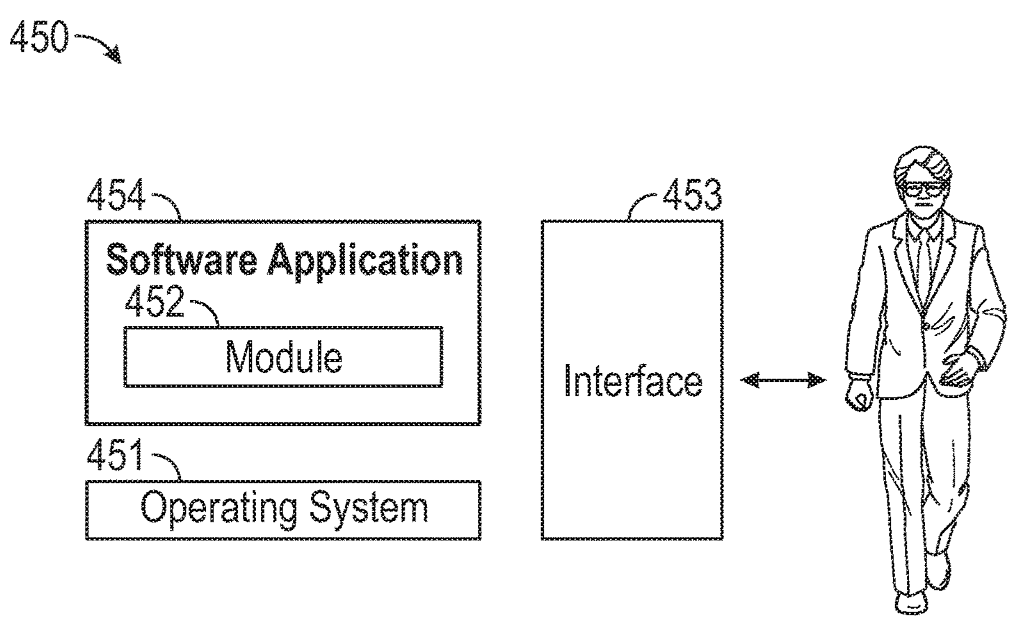
FIG. 7 illustrates a schematic view of a software system including a module, an operating system, and a user interface, in accordance with an embodiment.

FIGS. 6-7 are shown only as exemplary diagrams of data-processing environments in which example embodiments may be implemented. It should be appreciated that FIGS. 6-7 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

As illustrated in FIG. 6, some embodiments may be implemented in the context of a data-processing system/apparatus 135 that can include, for example, one or more processors such as a processor 341 (e.g., a CPU (Central Processing Unit) and/or other microprocessors), a memory 342, an input/output controller 343, a microcontroller 349, a peripheral USB (Universal Serial Bus) connection 347, a keyboard 344 and/or another input device 345 (e.g., a pointing device, such as a mouse, track ball, pen device, etc.), a display 346 (e.g., a monitor, touch screen display, etc.), and/or other peripheral connections and components. As illustrated, the various components of data-processing system/apparatus 135 can communicate electronically through a system bus 351 or similar architecture. The system bus 351 may be, for example, a subsystem that transfers data between, for example, computer components within data-processing system/apparatus 135 or to and from other data-processing devices, components, computers, etc. The data-processing system/apparatus 135 may be implemented in some embodiments as, for example, a server in a client-server based network (e.g., the Internet) or in the context of a client and a server (i.e., where aspects are practiced on the client and the server).

In some example embodiments, data-processing system/apparatus 135 may be, for example, a standalone desktop computer, a laptop computer, a Smartphone, a pad computing device and so on, wherein each such device is operably connected to and/or in communication with a client-server based network or other types of networks (e.g., cellular networks, Wi-Fi, etc.).

Note that the microcontroller 349 and the processor 341 shown in FIG. 6 may in some example embodiments implement the processor/microcontroller 22 depicted in FIG. 1. Thus, system 8 discussed previously can be adapted for use with a data processing system or apparatus such as the system 135 shown in FIG. 6.

FIG. 7 illustrates a computer software system/apparatus 450 for directing the operation of the data-processing system/apparatus 135 depicted in FIG. 6. Software application 454, stored for example in memory 342, generally includes a kernel or operating system 451 and a shell or interface 453. One or more application programs, such as software application 454, may be "loaded" (i.e., transferred from, for example, mass storage or another memory location into the memory 342) for execution by the data-processing system/apparatus 135. The data-processing system/apparatus 135 can receive user commands and data through the interface 453; these inputs may then be acted upon by the data-processing system/apparatus 135 in accordance with instructions from operating system 451 and/or software application 454. The interface 453 in some embodiments can serve to display results, whereupon a user may supply additional inputs or terminate a session. The software application 454 can include module(s) 452, which can, for example, implement instructions or operations such as those discussed herein with respect to FIGS. 1-5 herein.

The following discussion is intended to provide a brief, general description of suitable computing environments in which the system and method may be implemented. Although not required, the disclosed embodiments will be described in the general context of computer-executable instructions, such as program modules, being executed by a single computer. In most instances, a "module" can constitute a software application, but can also be implemented as both software and hardware (i.e., a combination of software and hardware).

Generally, program modules include, but are not limited to, routines, subroutines, software applications, programs, objects, components, data structures, etc., that perform particular tasks or implement particular data types and instructions. Moreover, those skilled in the art will appreciate that the disclosed method and system may be practiced with other computer system configurations, such as, for example, hand-held devices, multi-processor systems, data networks, microprocessor-based or programmable consumer electronics, networked PCs, minicomputers, mainframe computers, servers, and the like.

Note that the term module as utilized herein may refer to a collection of routines and data structures that perform a particular task or implements a particular data type. Modules may be composed of two parts: an interface, which lists the constants, data types, variable, and routines that can be accessed by other modules or routines, and an implementation, which is typically private (accessible only to that module) and which includes source code that actually implements the routines in the module. The term module may also simply refer to an application, such as a computer program designed to assist in the performance of a specific task, such as word processing, accounting, inventory management, etc.

FIGS. 6-7 are thus intended as examples and not as architectural limitations of disclosed embodiments. Additionally, such embodiments are not limited to any particular application or computing or data processing environment. Instead, those skilled in the art will appreciate that the disclosed approach may be advantageously applied to a variety of systems and application software. Moreover, the disclosed embodiments can be embodied on a variety of different computing platforms, including Macintosh, UNIX, LINUX, and the like.

The disclosed embodiments thus relate to a device and/or system for imaging magnetic fields as an array of vectors in two and/or three dimensions. The device or system can image magnetic fields without any relative motion between the field and the sensor, and is fully capable of imaging static magnetic fields, and displaying the field as either a vector array with both magnitude and direction at each sensing point in space, or as a scalar image with each point being calculated from the vector components of the magnetic field.

The disclosed embodiments can include an N×N vector magnetometer array that is used to image magnetic fields including static magnetic fields as a full, three dimensional vector field. The disclosed embodiments allow the abstract concept of a magnetic field to be viewed. The disclosed embodiments can image current flow in real time allowing semiconductor device manufacturers to see physical current flows. In an example embodiment, the disclosed system/device can be utilized as a pedagogical tool in classrooms to view in real time what is normally an abstract concept. The device also has laboratory uses in several scientific fields. The disclosed device/system can additionally be utilized to image electrical current flowing. The technology disclosed herein can be easily and inexpensively implemented in some example embodiments in the context of a portable unit, which is another reason for its viability in a commercial product.

Note that some example embodiments can be implemented in the context of a method or process. For example, in an example embodiment, a magnetic field vector imaging array method can includes steps, operations, or instructions for imaging at least one magnetic field as a full two or three-dimensional vector field utilizing a magnetometer array, thereby allowing the at least one magnetic field to be viewable; and displaying via an electronic display an image of the at least one magnetic field as a vector array with both magnitude and direction at each sensing point in space or as a scalar image with each point being calculated from vector components of the at least one magnetic field, the electronic display operably connected to the magnetometer array.

The claims, description, and drawings of this application may describe one or more of the instant technologies in operational/functional language, for example, as a set of operations (e.g., the operations or instructions with respect to the magnetic field vector imaging array method discussed above) to be performed by a computer. Such operational/functional description in most instances can be specifically-configured hardware (e.g., because a general purpose computer in effect becomes a special purpose computer once it is programmed to perform particular functions pursuant to instructions from program software).

Importantly, although the operational/functional descriptions described herein are understandable by the human mind, they are not abstract ideas of the operations/functions divorced from computational implementation of those operations/functions. Rather, the operations/functions represent a specification for the massively complex computational machines or other means. As discussed in detail below, the operational/functional language must be read in its proper technological context, i.e., as concrete specifications for physical implementations.

The logical operations/functions described herein can be a distillation of machine specifications or other physical mechanisms specified by the operations/functions such that the otherwise inscrutable machine specifications may be comprehensible to the human mind. The distillation also allows one skilled in the art to adapt the operational/functional description of the technology across many different specific vendors' hardware configurations or platforms, without being limited to specific vendors' hardware configurations or platforms.

Some of the present technical description (e.g., detailed description, drawings, claims, etc.) may be set forth in terms of logical operations/functions. As described in more detail in the following paragraphs, these logical operations/functions are not representations of abstract ideas, but rather representative of static or sequenced specifications of various hardware elements. Differently stated, unless context dictates otherwise, the logical operations/functions are representative of static or sequenced specifications of various hardware elements. This is true because tools available to implement technical disclosures set forth in operational/functional formats—tools in the form of a high-level programming language (e.g., C, Java, Visual Basic, etc.), or tools in the form of Very high speed Hardware Description Language ("VHDL," which is a language that uses text to describe logic circuits)—are generators of static or sequenced specifications of various hardware configurations. This fact is sometimes obscured by the broad term "software," but, as shown by the following explanation, what is termed "software" is a shorthand for a massively complex interchaining/specification of ordered-matter elements. The term "ordered-matter elements" may refer to physical components of computation, such as assemblies of electronic logic gates, molecular computing logic constituents, quantum computing mechanisms, etc.

For example, a high-level programming language is a programming language with strong abstraction, e.g., multiple levels of abstraction, from the details of the sequential organizations, states, inputs, outputs, etc., of the machines that a high-level programming language actually specifies. In order to facilitate human comprehension, in many instances, high-level programming languages resemble or even share symbols with natural languages.

It has been argued that because high-level programming languages use strong abstraction (e.g., that they may resemble or share symbols with natural languages), they are therefore a "purely mental construct." (e.g., that "software"—a computer program or computer-programming—is somehow an ineffable mental construct, because at a high level of abstraction, it can be conceived and understood in the human mind). This argument has been used to characterize technical description in the form of functions/operations as somehow "abstract ideas." In fact, in technological arts (e.g., the information and communication technologies) this is not true.

The fact that high-level programming languages use strong abstraction to facilitate human understanding should not be taken as an indication that what is expressed is an abstract idea. In an embodiment, if a high-level programming language is the tool used to implement a technical disclosure in the form of functions/operations, it can be understood that, far from being abstract, imprecise, "fuzzy," or "mental" in any significant semantic sense, such a tool is instead a near incomprehensibly precise sequential specification of specific computational—machines—the parts of which are built up by activating/selecting such parts from typically more general computational machines over time (e.g., clocked time). This fact is sometimes obscured by the superficial similarities between high-level programming languages and natural languages. These superficial similarities also may cause a glossing over of the fact that high-level programming language implementations ultimately perform valuable work by creating/controlling many different computational machines.

The many different computational machines that a high-level programming language specifies are almost unimaginably complex. At base, the hardware used in the computational machines typically consists of some type of ordered matter (e.g., traditional electronic devices (e.g., transistors), deoxyribonucleic acid (DNA), quantum devices, mechanical switches, optics, fluidics, pneumatics, optical devices (e.g., optical interference devices), molecules, etc.) that are arranged to form logic gates. Logic gates are typically physical devices that may be electrically, mechanically, chemically, or otherwise driven to change physical state in order to create a physical reality of Boolean logic.

Logic gates may be arranged to form logic circuits, which are typically physical devices that may be electrically, mechanically, chemically, or otherwise driven to create a physical reality of certain logical functions. Types of logic circuits include such devices as multiplexers, registers, arithmetic logic units (ALUs), computer memory devices, etc., each type of which may be combined to form yet other types of physical devices, such as a central processing unit (CPU)—the best known of which is the microprocessor. A modern microprocessor will often contain more than one hundred million logic gates in its many logic circuits (and often more than a billion transistors).

The logic circuits forming the microprocessor are arranged to provide a microarchitecture that will carry out the instructions defined by that microprocessor's defined Instruction Set Architecture. The Instruction Set Architecture is the part of the microprocessor architecture related to programming, including the native data types, instructions, registers, addressing modes, memory architecture, interrupt and exception handling, and external Input/Output.

The Instruction Set Architecture includes a specification of the machine language that can be used by programmers to use/control the microprocessor. Since the machine language instructions are such that they may be executed directly by the microprocessor, typically they consist of strings of binary digits, or bits. For example, a typical machine language instruction might be many bits long (e.g., 32, 64, or 128 bit strings are currently common). A typical machine language instruction might take the form "11110000101011110000111100111111" (a 32 bit instruction).

It is significant here that, although the machine language instructions are written as sequences of binary digits, in actuality those binary digits specify physical reality. For example, if certain semiconductors are used to make the operations of Boolean logic a physical reality, the apparently mathematical bits "1" and "0" in a machine language instruction actually constitute a shorthand that specifies the application of specific voltages to specific wires. For example, in some semiconductor technologies, the binary number "1" (e.g., logical "1") in a machine language instruction specifies around +5 volts applied to a specific "wire" (e.g., metallic traces on a printed circuit board) and the binary number "O" (e.g., logical "0") in a machine language instruction specifies around −5 volts applied to a specific "wire." In addition to specifying voltages of the machines' configuration, such machine language instructions also select out and activate specific groupings of logic gates from the millions of logic gates of the more general machine. Thus, far from abstract mathematical expressions, machine language instruction programs, even though written as a string of zeros and ones, specify many, many constructed physical machines or physical machine states.

Machine language is typically incomprehensible by most humans (e.g., the above example was just ONE instruction, and some personal computers execute more than two billion instructions every second).

Thus, programs written in machine language—which may be tens of millions of machine language instructions long—are incomprehensible. In view of this, early assembly languages were developed that used mnemonic codes to refer to machine language instructions, rather than using the machine language instructions' numeric values directly (e.g., for performing a multiplication operation, programmers coded the abbreviation "mult," which represents the binary number "011000" in MIPS machine code). While assembly languages were initially a great aid to humans controlling the microprocessors to perform work, in time the complexity of the work that needed to be done by the humans outstripped the ability of humans to control the microprocessors using merely assembly languages.

At this point, it was noted that the same tasks needed to be done over and over, and the machine language necessary to do those repetitive tasks was the same. In view of this, compilers were created. A compiler is a device that takes a statement that is more comprehensible to a human than either machine or assembly language, such as "add 2+2 and output the result," and translates that human understandable statement into a complicated, tedious, and immense machine language code (e.g., millions of 32, 64, or 128 bit length strings). Compilers thus translate high-level programming language into machine language.

This compiled machine language, as described above, is then used as the technical specification which sequentially constructs and causes the interoperation of many different computational machines such that humanly useful, tangible, and concrete work is done. For example, as indicated above, such machine language—the compiled version of the higher-level language—functions as a technical specification, which selects out hardware logic gates, specifies voltage levels, voltage transition timings, etc., such that the humanly useful work is accomplished by the hardware.

Thus, a functional/operational technical description, when viewed by one skilled in the art, is far from an abstract idea. Rather, such a functional/operational technical description, when understood through the tools available in the art such as those just described, is instead understood to be a humanly understandable representation of a hardware specification, the complexity and specificity of which far exceeds the comprehension of most any one human. Accordingly, any such operational/functional technical descriptions may be understood as operations made into physical reality by (a) one or more interchained physical machines, (b) interchained logic gates configured to create one or more physical machine(s) representative of sequential/combinatorial logic(s), (c) interchained ordered matter making up logic gates (e.g., interchained electronic devices (e.g., transistors), DNA, quantum devices, mechanical switches, optics, fluidics, pneumatics, molecules, etc.) that create physical reality representative of logic(s), or (d) virtually any combination of the foregoing. Indeed, any physical object, which has a stable, measurable, and changeable state may be used to construct a machine based on the above technical description. Charles Babbage, for example, constructed the first computer out of wood and powered by cranking a handle.

Thus, far from being understood as an abstract idea, it can be recognized that a functional/operational technical description as a humanly-understandable representation of one or more almost unimaginably complex and time sequenced hardware instantiations. The fact that functional/operational technical descriptions might lend themselves readily to high-level computing languages (or high-level block diagrams for that matter) that share some words, structures, phrases, etc. with natural language simply cannot be taken as an indication that such functional/operational technical descriptions are abstract ideas, or mere expressions of abstract ideas. In fact, as outlined herein, in the technological arts this is simply not true. When viewed through the tools available to those skilled in the art, such functional/operational technical descriptions are seen as specifying hardware configurations of almost unimaginable complexity.

As outlined above, the reason for the use of functional/operational technical descriptions is at least twofold. First, the use of functional/operational technical descriptions allows near-infinitely complex machines and machine operations arising from interchained hardware elements to be described in a manner that the human mind can process (e.g., by mimicking natural language and logical narrative flow). Second, the use of functional/operational technical descriptions assists the person skilled in the art in understanding the described subject matter by providing a description that is more or less independent of any specific vendor's piece(s) of hardware.

The use of functional/operational technical descriptions assists the person skilled in the art in understanding the described subject matter since, as is evident from the above discussion, one could easily, although not quickly, transcribe the technical descriptions set forth in this document as trillions of ones and zeroes, billions of single lines of assembly-level machine code, millions of logic gates, thousands of gate arrays, or any number of intermediate levels of abstractions. However, if any such low-level technical descriptions were to replace the present technical description, a person skilled in the art could encounter undue difficulty in implementing the disclosure, because such a low-level technical description would likely add complexity without a corresponding benefit (e.g., by describing the subject matter utilizing the conventions of one or more vendor-specific pieces of hardware). Thus, the use of functional/operational technical descriptions assists those skilled in the art by separating the technical descriptions from the conventions of any vendor-specific piece of hardware.

In view of the foregoing, the logical operations/functions set forth in the present technical description are representative of static or sequenced specifications of various ordered-matter elements, in order that such specifications may be comprehensible to the human mind and adaptable to create many various hardware configurations. The logical operations/functions disclosed herein should be treated as such, and should not be disparagingly characterized as abstract ideas merely because the specifications they represent are presented in a manner that one skilled in the art can readily understand and apply in a manner independent of a specific vendor's hardware implementation.

At least a portion of the devices or processes described herein can be integrated into an information processing system. An information processing system generally includes one or more of a system unit housing, a video display device, memory, such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), or control systems including feedback loops and control motors (e.g., feedback for detecting position or velocity, control motors for moving or adjusting components or quantities). An information processing system can be implemented utilizing suitable commercially available components, such as those typically found in data computing/communication or network computing/communication systems.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes or systems or other technologies described herein can be effected (e.g., hardware, software, firmware, etc., in one or more machines or articles of manufacture), and that the preferred vehicle will vary with the context in which the processes, systems, other technologies, etc., are deployed. For example, if an implementer determines that speed and accuracy are paramount, the implementer may opt for a mainly hardware or firmware vehicle; alternatively, if flexibility is paramount, the implementer may opt for a mainly software implementation that is implemented in one or more machines or articles of manufacture; or, yet again alternatively, the implementer may opt for some combination of hardware, software, firmware, etc., in one or more machines or articles of manufacture.

Hence, there are several possible vehicles by which the processes, devices, other technologies, etc., described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. In an embodiment, optical aspects of implementations will typically employ optically-oriented hardware, software, firmware, etc., in one or more machines or articles of manufacture.

The herein described subject matter sometimes illustrates different components contained within, or connected with, different other components. It is to be understood that such depicted architectures are merely examples, and that in fact, many other architectures can be implemented that achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality, and any two components capable of being so associated can also be viewed as being "operably coupleable" to each other to achieve the desired functionality. Specific examples of operably coupleable include, but are not limited to, physically mateable, physically interacting components, wirelessly interactable, wirelessly interacting components, logically interacting, logically interactable components, etc.

In an example embodiment, one or more components may be referred to herein as "configured to," "configurable to," "operable/operative to," "adapted/adaptable," "able to," "conformable/conformed to," etc. Such terms (e.g., "configured to") can generally encompass active-state components, or inactive-state components, or standby-state components, unless context requires otherwise.

The foregoing detailed description has set forth various embodiments of the devices or processes via the use of block diagrams, flowcharts, or examples. Insofar as such block diagrams, flowcharts, or examples contain one or more functions or operations, it will be understood by the reader that each function or operation within such block diagrams, flowcharts, or examples can be implemented, individually or collectively, by a wide range of hardware, software, firmware in one or more machines or articles of manufacture, or virtually any combination thereof. Further, the use of "Start," "End," or "Stop" blocks in the block diagrams is not intended to indicate a limitation on the beginning or end of any function in the diagram. Such flowcharts or diagrams may be incorporated into other flowcharts or diagrams where additional functions are performed before or after the functions shown in the diagrams of this application. In an embodiment, several portions of the subject matter described herein is implemented via Application Specific Integrated Circuits (ASICs), Field Programmable Gate Arrays (FPGAs), digital signal processors (DSPs), or other integrated formats. However, some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry or writing the code for the software and/or firmware would be well within the skill of one skilled in the art in light of this disclosure.

In addition, the mechanisms of the subject matter described herein are capable of being distributed as a program product in a variety of forms, and that an illustrative embodiment of the subject matter described herein applies regardless of the particular type of signal-bearing medium used to actually carry out the distribution. Non-limiting examples of a signal-bearing medium include the following: a recordable type medium such as a floppy disk, a hard disk drive, a Compact Disc (CD), a Digital Video Disk (DVD), a digital tape, a computer memory, etc.; and a transmission type medium such as a digital or an analog communication medium (e.g., a fiber optic cable, a waveguide, a wired communications link, a wireless communication link (e.g., transmitter, receiver, transmission logic, reception logic, etc.), etc.).

While particular aspects of the present subject matter described herein have been shown and described, it will be apparent to the reader that, based upon the teachings herein, changes and modifications can be made without departing from the subject matter described herein and its broader aspects and, therefore, the appended claims are to encompass within their scope all such changes and modifications as are within the true spirit and scope of the subject matter described herein. In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Further, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense of the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense of the convention (e.g., "a system having at least one of A, B, or C" would include but not be limited to systems that have A alone, B alone, C alone, A and B together, A and C together, B and C together, and/or A, B, and C together, etc.). Typically a disjunctive word or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, the operations recited therein generally may be performed in any order. Also, although various operational flows are presented in a sequence(s), it should be understood that the various operations may be performed in orders other than those that are illustrated, or may be performed concurrently. Examples of such alternate orderings includes overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It will be appreciated that variations of the above-disclosed and other features and functions, or alternatives thereof, may be desirably combined into many other different systems or applications. Also, it will be appreciated that various presently unforeseen or unanticipated alternatives, modifications, variations or improvements therein may be subsequently made by those skilled in the art which are also intended to be encompassed by the following claims.

What is claimed is:

1. A magnetic field vector imaging array system, comprising:

a magnetometer array that images at least one magnetic field as a full two or three-dimensional vector field, thereby allowing said at least one magnetic field to be viewable;

at least one demultiplexer operatively connected to the magnetometer array, wherein said at least one demultiplexer receives a single input line and routes said single input line to at least one of a plurality of digital output lines, wherein said at least one demultiplexer receives at least one analog signal output from the magnetometer array;

an analog-to-digital converter operatively connected to said at least one demultiplexer, wherein said analog-to-digital converter receives an analog signal from said at least one demultiplexer and converts said analog signal to a digital signal comprising data indicative of an image of said at least one magnetic field;

an electronic display that is displays in a GUI (Graphical User Interface), said image of said at least one magnetic field as a vector array with both magnitude and direction at each sensing point in space or as a scalar image with each point being calculated from vector components of said at least one magnetic field.

2. The system of claim 1 wherein said magnetometer array further images current flow at a surface of a conductor in real time.

3. The system of claim 1 wherein said magnetometer array comprises an N×N vector magnetometer array.

4. The system of claim 1 wherein said magnetometer array comprises a sensor array that includes a plurality of Hall-Effect devices aligned orthogonally with one another in perpendicular alignment that creates two-dimensional Cartesian coordinate system or a three-dimensional Cartesian coordinate system within which to reference separate readings from Hall-effect devices among said plurality of Hall-effect devices.

5. The system of claim 1 further comprising a microprocessor and/or microcontroller that orchestrate a timing of and a transfer of data within said system including said data indicative of an image of said at least one magnetic field.

6. The system of claim 5 wherein said microprocessor of said microprocessor and/or microcontroller reads in said digital signal output from said analog-digital converter and transfers said digital signal to a host computer for a reconstruction of a vector image or a scalar image of an applied magnetic field with respect to said at least one magnetic field.

7. The system of claim 6 wherein said electronic display comprises a liquid crystal display for viewing said image and wherein said analog-to-digital converter comprises a two-channel analog-to-digital converter.

8. The system of claim 4 wherein said plurality of Hall-Effect devices comprises a plurality of MEMS fabricated Hall-Effect structures configured on a single IC chip, said plurality of Hall-Effect devices including at least one y-axis Hall-Effect sensor and at least one x-axis Hall-Effect sensor, wherein said at least one y-axis Hall-Effect sensor is placed in a configuration in which a normal vector of a sensing axis of said at least one y-axis Hall-Effect Sensor is parallel to a selected y-axis reference, and said x-axis Hall-Effect Sensor is placed in said configuration in which said x-axis Hall-Effect sensor is lined with a normal vector parallel to a predetermined x-axis, wherein when once arbitrary axes are selected all sensing devices among said plurality of Hall-effect devices in said magnetometer array are aligned with a selected coordinate system comprising said two-dimensional Cartesian coordinate system or said three-dimensional Cartesian coordinate system.

9. A magnetic field vector imaging array method, comprising:

imaging at least one magnetic field as a full two or three-dimensional vector field utilizing a magnetometer array, thereby allowing said at least one magnetic field to be viewable;

providing at least one analog signal from said magnetometer array to at least one demultiplexer operatively connected to said magnetometer array, wherein said at least one demultiplexer receives a single input line and routes said single input line to at least one of a plurality of digital output lines, wherein said at least one demultiplexer receives said at least one analog signal output from the magnetometer array;

outputting an analog signal from said at least one demultiplexer to an analog-to-digital converter operatively connected to said at least one demultiplexer, wherein said analog-to-digital converter receives said analog signal from said at least one demultiplexer and converts said analog signal to a digital signal comprising data indicative of an image of said at least one magnetic field; and displaying via a GUI (Graphical User Interface) in an electronic display, said image of said at least one magnetic field as a vector array with both magnitude and direction at each sensing point in space or as a scalar image with each point being calculated from vector components of said at least one magnetic field.

10. The method of claim 9 wherein said magnetometer array further images current flow at a surface of a conductor in real time.

11. The method of claim 9 wherein said magnetometer array comprises an N×N vector magnetometer array.

12. The method of claim 9 wherein said magnetometer array comprises a sensor array that includes a plurality of Hall-Effect devices aligned orthogonally with one another in perpendicular alignment that creates two-dimensional Cartesian coordinate system or a three-dimensional Cartesian coordinate system within which to reference separate readings from Hall-effect devices among said plurality of Hall-effect devices.

13. The method of claim 9 further comprising orchestrating a timing of and a transfer of data within said system via a microprocessor and/or microcontroller including said data indicative of an image of said at least one magnetic field.

14. The system of claim 13 wherein said microprocessor of said microprocessor and/or microcontroller reads in said digital signal output from said analog-digital converter and transfers said digital signal to a host computer for a reconstruction of a vector image or a scalar image of an applied magnetic field with respect to said at least one magnetic field.

15. The method of claim 14 wherein said electronic display comprises a liquid crystal display for viewing said image and wherein said analog-to-digital converter comprises a two-channel analog-to-digital converter.

16. The method of claim 12 wherein said plurality of Hall-Effect devices comprises a plurality of MEMS fabricated Hall-Effect structures configured on a single IC chip, said plurality of Hall-Effect devices including at least one y-axis Hall-Effect sensor and at least one x-axis Hall-Effect sensor, wherein said at least one y-axis Hall-Effect sensor is placed in a configuration in which a normal vector of a sensing axis of said at least one y-axis Hall-Effect Sensor is parallel to a selected y-axis reference, and said x-axis Hall-Effect Sensor is placed in said configuration in which said x-axis Hall-Effect sensor is lined with a normal vector parallel to a predetermined x-axis, wherein when once arbitrary axes are selected all sensing devices among said plurality of Hall-effect devices in said magnetometer array are aligned with a selected coordinate system comprising said two-dimensional Cartesian coordinate system or said three-dimensional Cartesian coordinate system.

17. A magnetic field vector imaging array system, comprising:

a magnetometer array comprising an N×N vector magnetometer array that images at least one magnetic field as a full two or three-dimensional vector field and also images current flow at a surface of a conductor in real time, thereby allowing said at least one magnetic field to be viewable, said magnetometer array comprising a sensor array that includes a plurality of Hall-Effect devices;

at least one demultiplexer operatively connected to the magnetometer array, wherein said at least one demultiplexer receives a single input line and routes said single input line to at least one of a plurality of digital output lines, wherein said at least one demultiplexer receives at least one analog signal output from the magnetometer array;

an analog-to-digital converter operatively connected to said at least one demultiplexer, wherein said analog-to-digital converter receives an analog signal from said at least one demultiplexer and converts said analog signal to a digital signal comprising data indicative of an image of said at least one magnetic field; and an electronic display that includes a GUI (Graphical User Interface) that displays said image of said at least one magnetic field as a vector array with both magnitude and direction at each sensing point in space or as a scalar image with each point being calculated from vector components of said at least one magnetic field.

18. The system of claim 17 further comprises a microprocessor and/or microcontroller that orchestrate a timing of and a transfer of data within said system including said data indicative of an image of said at least one magnetic field, and wherein said microprocessor of said microprocessor and/or said microcontroller reads in said digital output of said analog-to-digital converter and transfers said digital signal to a host computer fora reconstruction of a vector image or a scalar image of an applied magnetic field with respect to said at least one magnetic field.

19. The system of claim 18 wherein said electronic display comprises a liquid crystal display for viewing said image and wherein said analog-to-digital converter comprises a two-channel analog-to-digital converter.

20. The system of claim 17 wherein said plurality of Hall-Effect devices comprises a plurality of MEMS fabricated Hall-Effect structures configured on a single IC chip, said plurality of Hall-Effect devices including at least one y-axis Hall-Effect sensor and at least one x-axis Hall-Effect sensor, wherein said at least one y-axis Hall-Effect sensor is placed in a configuration in which a normal vector of a sensing axis of said at least one y-axis Hall-Effect Sensor is parallel to a selected y-axis reference, and said x-axis Hall-Effect Sensor is placed in said configuration in which said x-axis Hall-Effect sensor is lined with a normal vector parallel to a predetermined x-axis, wherein when once arbitrary axes are selected all sensing devices among said plurality of Hall-effect devices in said magnetometer array are aligned with a selected coordinate system comprising said two-dimensional Cartesian coordinate system or said three-dimensional Cartesian coordinate system.

* * * * *